US008941222B2

(12) United States Patent
Hunt

(10) Patent No.: US 8,941,222 B2
(45) Date of Patent: Jan. 27, 2015

(54) WAFER LEVEL SEMICONDUCTOR PACKAGE AND MANUFACTURING METHODS THEREOF

(75) Inventor: John Richard Hunt, Chandler, AZ (US)

(73) Assignee: Advanced Semiconductor Engineering Inc., Kaosiung (TW)

( * ) Notice: Subject to any disclaimer, the term of this patent is extended or adjusted under 35 U.S.C. 154(b) by 1104 days.

(21) Appl. No.: 12/944,697

(22) Filed: Nov. 11, 2010

(65) Prior Publication Data

US 2012/0119373 A1    May 17, 2012

(51) Int. Cl.
*H01L 23/02* (2006.01)
*H01L 23/31* (2006.01)
(Continued)

(52) U.S. Cl.
CPC ......... *H01L 23/3128* (2013.01); *H01L 21/565* (2013.01); *H01L 21/568* (2013.01); *H01L 23/295* (2013.01); *H01L 23/296* (2013.01); *H01L 23/49811* (2013.01); *H01L 23/49827* (2013.01); *H01L 24/19* (2013.01); *H01L 24/20* (2013.01); *H01L 25/105* (2013.01); *H01L 24/05* (2013.01); *H01L 2225/1035* (2013.01); *H01L 2225/1058* (2013.01); *H01L 2924/01013* (2013.01); *H01L 2924/01029* (2013.01); *H01L 2924/01033* (2013.01); *H01L 2924/01075* (2013.01); *H01L 2924/014* (2013.01); *H01L 2224/02379* (2013.01); *H01L 24/11* (2013.01); *H01L 24/13* (2013.01); *H01L 2224/02377* (2013.01); *H01L 2224/0239* (2013.01);
(Continued)

(58) Field of Classification Search
USPC ......... 257/678, 686, 396, 737, 734, 787, 782, 257/781, E21.006, E21.014, E21.267, 257/E21.32, E21.499, E21.502, E21.503, 257/E21.508
See application file for complete search history.

(56) References Cited

U.S. PATENT DOCUMENTS 3,959,874 A    6/1976   Coucoulas
4,783,695 A   11/1988   Eichelberger et al.
(Continued)

FOREIGN PATENT DOCUMENTS

CN   1524293 A   10/2001
FR   2572849     5/1986
(Continued)

OTHER PUBLICATIONS

Ding et al., U.S. Appl. No. 12/753,840, filed Apr. 2, 2010 for "Semiconductor Device Packages with Fan-Out and with Connecting Elements for Stacking and Manufacturing Methods Thereof".
(Continued)

*Primary Examiner* — David Nhu
(74) *Attorney, Agent, or Firm* — Foley & Lardner LLP; Cliff Z. Liu; Angela D. Murch

(57) ABSTRACT

A semiconductor package includes at least one semiconductor die having an active surface, an interposer element having an upper surface and a lower surface, a package body, and a lower redistribution layer. The interposer element has at least one conductive via extending between the upper surface and the lower surface. The package body encapsulates portions of the semiconductor die and portions of the interposer element. The lower redistribution layer electrically connects the interposer element to the active surface of the semiconductor die.

20 Claims, 10 Drawing Sheets

(51) Int. Cl.
*H01L 21/56* (2006.01)
*H01L 23/29* (2006.01)
*H01L 23/498* (2006.01)
*H01L 23/00* (2006.01)
*H01L 25/10* (2006.01)

(52) U.S. Cl.
CPC ............. *H01L2224/04105* (2013.01); *H01L 2224/05548* (2013.01); *H01L 2224/05624* (2013.01); *H01L 2224/05647* (2013.01); *H01L 2224/05666* (2013.01); *H01L 2224/11849* (2013.01); *H01L 2224/12105* (2013.01); *H01L 2224/13022* (2013.01); *H01L 2224/131* (2013.01); *H01L 2225/1041* (2013.01); *H01L 2924/14* (2013.01); *H01L 2924/18162* (2013.01)
USPC ............... 257/678; 257/787; 257/E21.006; 257/E21.014; 257/E21.267; 257/E21.32; 257/E21.499; 257/E21.502; 257/E21.503; 257/E21.508

(56) References Cited

U.S. PATENT DOCUMENTS

| | | | |
|---|---|---|---|
| 4,897,708 A | 1/1990 | Clements | |
| 4,939,568 A | 7/1990 | Kato et al. | |
| 5,019,535 A | 5/1991 | Wojnarowski et al. | |
| 5,049,980 A | 9/1991 | Saito et al. | |
| 5,091,769 A | 2/1992 | Eichelberger | |
| 5,111,278 A | 5/1992 | Eichelberger | |
| 5,120,678 A | 6/1992 | Moore et al. | |
| 5,149,662 A | 9/1992 | Eichelberger | |
| 5,151,770 A | 9/1992 | Inoue | |
| 5,151,776 A | 9/1992 | Wojnarowski et al. | |
| 5,157,589 A | 10/1992 | Cole, Jr. et al. | |
| 5,166,772 A | 11/1992 | Soldner et al. | |
| 5,225,023 A | 7/1993 | Wojnarowski et al. | |
| 5,241,456 A | 8/1993 | Marcinkiewicz et al. | |
| 5,250,843 A | 10/1993 | Eichelberger | |
| 5,315,486 A | 5/1994 | Fillion et al. | |
| 5,324,687 A | 6/1994 | Wojnarowski | |
| 5,353,195 A | 10/1994 | Fillion et al. | |
| 5,353,498 A | 10/1994 | Fillion et al. | |
| 5,355,016 A | 10/1994 | Swirbel et al. | |
| 5,422,513 A | 6/1995 | Marcinkiewicz et al. | |
| 5,519,936 A | 5/1996 | Andros et al. | |
| 5,527,741 A | 6/1996 | Cole et al. | |
| 5,546,654 A | 8/1996 | Wojnarowski et al. | |
| 5,554,887 A | 9/1996 | Sawai et al. | |
| 5,567,656 A | 10/1996 | Chun | |
| 5,703,400 A | 12/1997 | Wojnarowski et al. | |
| 5,710,062 A | 1/1998 | Sawai et al. | |
| 5,745,984 A | 5/1998 | Cole, Jr. et al. | |
| 5,834,340 A | 11/1998 | Sawai et al. | |
| 5,841,193 A | 11/1998 | Eichelberger | |
| 5,866,952 A | 2/1999 | Wojnarowski et al. | |
| 5,998,867 A | 12/1999 | Jensen et al. | |
| 6,013,953 A | 1/2000 | Nishihara et al. | |
| 6,046,071 A | 4/2000 | Sawai et al. | |
| 6,080,932 A | 6/2000 | Smith et al. | |
| 6,117,704 A | 9/2000 | Yamaguchi et al. | |
| 6,154,366 A | 11/2000 | Ma et al. | |
| 6,159,767 A | 12/2000 | Eichelberger | |
| 6,232,151 B1 | 5/2001 | Ozmat et al. | |
| 6,239,482 B1 | 5/2001 | Fillion et al. | |
| 6,265,765 B1 | 7/2001 | DiStefano et al. | |
| 6,294,406 B1 | 9/2001 | Bertin et al. | |
| 6,294,741 B1 | 9/2001 | Cole, Jr. et al. | |
| 6,306,680 B1 | 10/2001 | Fillion et al. | |
| 6,358,780 B1 | 3/2002 | Smith et al. | |
| 6,377,461 B1 | 4/2002 | Ozmat et al. | |
| 6,396,148 B1 | 5/2002 | Eichelberger et al. | |
| 6,426,545 B1 | 7/2002 | Eichelberger et al. | |
| 6,448,174 B1 | 9/2002 | Ramm | |
| 6,485,595 B1 | 11/2002 | Yenni et al. | |
| 6,486,005 B1 | 11/2002 | Kim | |
| 6,486,006 B2 | 11/2002 | Hirano et al. | |
| 6,486,545 B1 | 11/2002 | Glenn et al. | |
| 6,555,906 B2 | 4/2003 | Towle et al. | |
| 6,555,908 B1 | 4/2003 | Eichelberger et al. | |
| 6,586,822 B1 | 7/2003 | Vu et al. | |
| 6,680,529 B2 | 1/2004 | Chen et al. | |
| 6,701,614 B2 | 3/2004 | Ding et al. | |
| 6,707,137 B2 | 3/2004 | Kim | |
| 6,713,859 B1 | 3/2004 | Ma | |
| 6,724,061 B2 | 4/2004 | Murata | |
| 6,818,544 B2 | 11/2004 | Eichelberger et al. | |
| 6,838,776 B2 | 1/2005 | Leal et al. | |
| 6,845,554 B2 | 1/2005 | Frankowsky et al. | |
| 6,921,683 B2 | 7/2005 | Nakayama | |
| 6,921,975 B2 | 7/2005 | Leal et al. | |
| 6,953,708 B2 | 10/2005 | Hedler et al. | |
| 6,969,916 B2 | 11/2005 | Shizuno | |
| 6,991,966 B2 | 1/2006 | Tuominen | |
| 7,015,075 B2 | 3/2006 | Fay et al. | |
| 7,045,908 B2 | 5/2006 | Ohsumi | |
| 7,048,450 B2 | 5/2006 | Beer et al. | |
| 7,078,788 B2 | 7/2006 | Vu et al. | |
| 7,087,991 B2 | 8/2006 | Chen et al. | |
| 7,091,595 B2 | 8/2006 | Fuergut et al. | |
| 7,112,467 B2 | 9/2006 | Eichelberger et al. | |
| 7,141,884 B2 | 11/2006 | Kojima et al. | |
| 7,145,228 B2 | 12/2006 | Yean et al. | |
| 7,163,843 B2 | 1/2007 | Kiendl et al. | |
| 7,173,330 B2 * | 2/2007 | Eng et al. | 257/700 |
| 7,224,061 B2 | 5/2007 | Yang et al. | |
| 7,238,602 B2 | 7/2007 | Yang | |
| 7,247,523 B1 | 7/2007 | Huemoeller et al. | |
| 7,294,529 B2 | 11/2007 | Tuominen | |
| 7,294,791 B2 | 11/2007 | Danoski et al. | |
| 7,299,546 B2 | 11/2007 | Tuominen et al. | |
| 7,319,049 B2 | 1/2008 | Oi et al. | |
| 7,344,917 B2 | 3/2008 | Gautham | |
| 7,361,533 B1 | 4/2008 | Huemoeller et al. | |
| 7,361,987 B2 | 4/2008 | Leal et al. | |
| 7,364,944 B2 | 4/2008 | Huang et al. | |
| 7,371,617 B2 | 5/2008 | Tsai et al. | |
| 7,425,464 B2 | 9/2008 | Fay et al. | |
| 7,453,148 B2 | 11/2008 | Yang et al. | |
| 7,476,563 B2 | 1/2009 | Mangrum et al. | |
| 7,482,198 B2 | 1/2009 | Bauer et al. | |
| 7,501,310 B2 | 3/2009 | Yang et al. | |
| 7,511,365 B2 | 3/2009 | Wu et al. | |
| 7,514,767 B2 | 4/2009 | Yang | |
| 7,557,307 B2 | 7/2009 | Nishizawa et al. | |
| 7,564,121 B2 | 7/2009 | Sugimoto | |
| 7,566,969 B2 | 7/2009 | Shimanuki | |
| 7,575,173 B2 | 8/2009 | Fuergut et al. | |
| 7,588,951 B2 | 9/2009 | Mangrum et al. | |
| 7,595,226 B2 | 9/2009 | Lytle et al. | |
| 7,595,553 B2 | 9/2009 | Nagamatsu et al. | |
| 7,609,527 B2 | 10/2009 | Tuominen et al. | |
| 7,619,304 B2 | 11/2009 | Bauer et al. | |
| 7,619,901 B2 | 11/2009 | Eichelberger et al. | |
| 7,622,733 B2 | 11/2009 | Fuergut et al. | |
| 7,625,818 B2 | 12/2009 | Wang | |
| 7,629,674 B1 | 12/2009 | Foster | |
| 7,655,501 B2 | 2/2010 | Yang et al. | |
| 7,662,667 B2 | 2/2010 | Shen | |
| 7,667,318 B2 | 2/2010 | Yang et al. | |
| 7,675,157 B2 | 3/2010 | Liu et al. | |
| 7,692,286 B1 | 4/2010 | Huemoeller et al. | |
| 7,714,431 B1 | 5/2010 | Huemoeller et al. | |
| 7,727,803 B2 | 6/2010 | Yamagata | |
| 7,732,242 B2 | 6/2010 | Brunnbauer et al. | |
| 7,741,151 B2 | 6/2010 | Amrine et al. | |
| 7,759,163 B2 | 7/2010 | Kroeninger et al. | |
| 7,763,976 B2 | 7/2010 | Tang et al. | |
| 7,767,495 B2 | 8/2010 | Fuergut et al. | |
| 7,772,046 B2 | 8/2010 | Pagaila et al. | |
| 7,799,602 B2 | 9/2010 | Pagaila et al. | |
| 7,807,512 B2 | 10/2010 | Lee et al. | |

(56) References Cited

U.S. PATENT DOCUMENTS

| | | | |
|---|---|---|---|
| 7,812,434 B2 | 10/2010 | Yang | |
| 7,829,987 B2 | 11/2010 | Chia | |
| 7,830,004 B2 | 11/2010 | Wu et al. | |
| 7,834,464 B2 | 11/2010 | Meyer et al. | |
| 7,932,599 B2 | 4/2011 | Kiendl et al. | |
| 7,948,090 B2 | 5/2011 | Manepalli et al. | |
| 8,017,515 B2 | 9/2011 | Marimuthu et al. | |
| 8,035,213 B2 | 10/2011 | Lee et al. | |
| 8,039,303 B2 | 10/2011 | Shim et al. | |
| 8,076,757 B2 | 12/2011 | Pagaila et al. | |
| 8,105,872 B2 | 1/2012 | Pagaila et al. | |
| 8,110,916 B2 | 2/2012 | Weng et al. | |
| 8,193,647 B2 | 6/2012 | Hsieh et al. | |
| 8,220,145 B2 | 7/2012 | Hiner et al. | |
| 8,222,976 B2 | 7/2012 | Yasooka | |
| 8,227,706 B2 * | 7/2012 | Roy et al. | 174/262 |
| 8,278,746 B2 | 10/2012 | Ding et al. | |
| 8,320,134 B2 | 11/2012 | Su et al. | |
| 8,358,001 B2 | 1/2013 | Yang et al. | |
| 8,362,597 B1 | 1/2013 | Foster | |
| 8,372,689 B2 | 2/2013 | Lee et al. | |
| 8,378,466 B2 | 2/2013 | Chiu et al. | |
| 8,405,213 B2 | 3/2013 | Chen et al. | |
| 8,410,584 B2 | 4/2013 | An et al. | |
| 8,432,022 B1 | 4/2013 | Huemoeller et al. | |
| 8,450,836 B2 | 5/2013 | Uemura et al. | |
| 8,471,215 B1 * | 6/2013 | Kurin et al. | 250/395 |
| 8,569,894 B2 | 10/2013 | Su et al. | |
| 8,624,374 B2 * | 1/2014 | Ding et al. | 257/686 |
| 2001/0008301 A1 | 7/2001 | Terui | |
| 2002/0056192 A1 | 5/2002 | Suwa et al. | |
| 2003/0090883 A1 | 5/2003 | Asahi et al. | |
| 2004/0012099 A1 | 1/2004 | Nakayama | |
| 2004/0155354 A1 | 8/2004 | Hanaoka et al. | |
| 2004/0178500 A1 | 9/2004 | Usui | |
| 2004/0231872 A1 | 11/2004 | Arnold et al. | |
| 2005/0253223 A1 | 11/2005 | Marques | |
| 2005/0253244 A1 | 11/2005 | Chang | |
| 2006/0065387 A1 | 3/2006 | Tonapi et al. | |
| 2006/0071315 A1 | 4/2006 | Oh et al. | |
| 2006/0231944 A1 | 10/2006 | Huang et al. | |
| 2007/0025092 A1 | 2/2007 | Lee et al. | |
| 2007/0069389 A1 | 3/2007 | Wollanke et al. | |
| 2007/0096311 A1 | 5/2007 | Humpston et al. | |
| 2007/0131349 A1 | 6/2007 | Tuominen et al. | |
| 2007/0145539 A1 | 6/2007 | Lam | |
| 2007/0145541 A1 | 6/2007 | Lee et al. | |
| 2007/0170595 A1 | 7/2007 | Sinha | |
| 2007/0176281 A1 | 8/2007 | Kim et al. | |
| 2007/0190690 A1 | 8/2007 | Chow et al. | |
| 2007/0221399 A1 | 9/2007 | Nishizawa et al. | |
| 2007/0222054 A1 | 9/2007 | Hembree | |
| 2007/0227761 A1 | 10/2007 | Tuominen et al. | |
| 2007/0234563 A1 | 10/2007 | Sakaguchi et al. | |
| 2007/0262422 A1 | 11/2007 | Bakalski et al. | |
| 2007/0273008 A1 | 11/2007 | Suzuki | |
| 2007/0296065 A1 | 12/2007 | Yew et al. | |
| 2008/0087988 A1 | 4/2008 | Lee et al. | |
| 2008/0089048 A1 | 4/2008 | Yamano et al. | |
| 2008/0094805 A1 | 4/2008 | Tuominen et al. | |
| 2008/0116564 A1 | 5/2008 | Yang et al. | |
| 2008/0136033 A1 | 6/2008 | Nagamatsu et al. | |
| 2008/0136041 A1 | 6/2008 | Katake et al. | |
| 2008/0137314 A1 | 6/2008 | Salama et al. | |
| 2008/0237879 A1 | 10/2008 | Yang | |
| 2008/0258293 A1 | 10/2008 | Yang | |
| 2008/0265421 A1 | 10/2008 | Brunnbauer et al. | |
| 2008/0272499 A1 | 11/2008 | DeNatale et al. | |
| 2008/0296697 A1 | 12/2008 | Hsu et al. | |
| 2008/0315375 A1 | 12/2008 | Eichelberger et al. | |
| 2008/0316714 A1 | 12/2008 | Eichelberger et al. | |
| 2009/0002971 A1 | 1/2009 | Carey et al. | |
| 2009/0014872 A1 | 1/2009 | Tuominen et al. | |
| 2009/0075428 A1 | 3/2009 | Tang et al. | |
| 2009/0101400 A1 | 4/2009 | Yamakoshi | |
| 2009/0102066 A1 | 4/2009 | Lee et al. | |
| 2009/0127680 A1 | 5/2009 | Do et al. | |
| 2009/0127686 A1 | 5/2009 | Yang et al. | |
| 2009/0129037 A1 | 5/2009 | Yoshino | |
| 2009/0133251 A1 | 5/2009 | Tuominen et al. | |
| 2009/0140436 A1 | 6/2009 | Wang | |
| 2009/0194851 A1 | 8/2009 | Chiu et al. | |
| 2009/0200648 A1 | 8/2009 | Graves | |
| 2009/0224391 A1 | 9/2009 | Lin et al. | |
| 2009/0236686 A1 | 9/2009 | Shim et al. | |
| 2009/0261466 A1 | 10/2009 | Pagaila et al. | |
| 2009/0278238 A1 | 11/2009 | Bonifield et al. | |
| 2009/0294928 A1 | 12/2009 | Kim et al. | |
| 2009/0302439 A1 | 12/2009 | Pagaila et al. | |
| 2009/0315156 A1 | 12/2009 | Harper | |
| 2010/0006330 A1 | 1/2010 | Fu et al. | |
| 2010/0006987 A1 | 1/2010 | Murugan et al. | |
| 2010/0006994 A1 | 1/2010 | Shim et al. | |
| 2010/0013065 A1 | 1/2010 | Mistry et al. | |
| 2010/0013081 A1 | 1/2010 | Toh et al. | |
| 2010/0019370 A1 | 1/2010 | Pressel et al. | |
| 2010/0032764 A1 | 2/2010 | Andry et al. | |
| 2010/0032815 A1 | 2/2010 | An et al. | |
| 2010/0059898 A1 | 3/2010 | Keeth et al. | |
| 2010/0072599 A1 | 3/2010 | Camacho et al. | |
| 2010/0072618 A1 | 3/2010 | Camacho et al. | |
| 2010/0078776 A1 | 4/2010 | Barth et al. | |
| 2010/0078777 A1 | 4/2010 | Barth et al. | |
| 2010/0078779 A1 | 4/2010 | Barth et al. | |
| 2010/0084759 A1 | 4/2010 | Shen | |
| 2010/0096739 A1 | 4/2010 | Kawabata et al. | |
| 2010/0109132 A1 | 5/2010 | Ko et al. | |
| 2010/0133704 A1 | 6/2010 | Marimuthu et al. | |
| 2010/0140759 A1 | 6/2010 | Pagaila et al. | |
| 2010/0163295 A1 | 7/2010 | Roy et al. | |
| 2010/0214780 A1 | 8/2010 | Villard | |
| 2010/0219514 A1 | 9/2010 | Ohguro | |
| 2010/0224983 A1 | 9/2010 | Huang et al. | |
| 2010/0237477 A1 | 9/2010 | Pagaila et al. | |
| 2010/0244208 A1 | 9/2010 | Pagaila et al. | |
| 2010/0270661 A1 | 10/2010 | Pagaila et al. | |
| 2010/0276792 A1 | 11/2010 | Chi et al. | |
| 2010/0308449 A1 | 12/2010 | Yang et al. | |
| 2010/0314726 A1 | 12/2010 | Mueller et al. | |
| 2010/0314746 A1 | 12/2010 | Hsieh et al. | |
| 2010/0320585 A1 | 12/2010 | Jiang et al. | |
| 2010/0320593 A1 | 12/2010 | Weng et al. | |
| 2011/0018118 A1 | 1/2011 | Hsieh et al. | |
| 2011/0018124 A1 | 1/2011 | Yang et al. | |
| 2011/0037169 A1 | 2/2011 | Pagaila et al. | |
| 2011/0068433 A1 | 3/2011 | Kim et al. | |
| 2011/0068453 A1 | 3/2011 | Cho et al. | |
| 2011/0068459 A1 | 3/2011 | Pagaila et al. | |
| 2011/0074008 A1 | 3/2011 | Hsieh | |
| 2011/0101509 A1 | 5/2011 | Han et al. | |
| 2011/0115059 A1 | 5/2011 | Lee et al. | |
| 2011/0115060 A1 | 5/2011 | Chiu et al. | |
| 2011/0115066 A1 | 5/2011 | Kim et al. | |
| 2011/0127654 A1 | 6/2011 | Weng et al. | |
| 2011/0140364 A1 | 6/2011 | Head | |
| 2011/0169150 A1 | 7/2011 | Su et al. | |
| 2011/0177654 A1 | 7/2011 | Lee et al. | |
| 2011/0194265 A1 | 8/2011 | Su et al. | |
| 2011/0227219 A1 | 9/2011 | Alvarado et al. | |
| 2011/0227220 A1 | 9/2011 | Chen et al. | |
| 2011/0241192 A1 | 10/2011 | Ding et al. | |
| 2011/0241193 A1 | 10/2011 | Ding et al. | |
| 2011/0241194 A1 | 10/2011 | Chen et al. | |
| 2011/0260302 A1 | 10/2011 | Bakalski et al. | |
| 2011/0278703 A1 | 11/2011 | Pagaila et al. | |
| 2011/0278741 A1 | 11/2011 | Chua et al. | |
| 2011/0298109 A1 | 12/2011 | Pagaila et al. | |
| 2011/0309488 A1 | 12/2011 | Pagaila | |
| 2012/0038053 A1 | 2/2012 | Oh et al. | |
| 2012/0056321 A1 | 3/2012 | Pagaila | |
| 2012/0074538 A1 | 3/2012 | Tsai et al. | |
| 2012/0077311 A1 | 3/2012 | Kim et al. | |
| 2012/0098109 A1 | 4/2012 | Ko et al. | |
| 2012/0104570 A1 | 5/2012 | Kim | |

(56) References Cited

U.S. PATENT DOCUMENTS

| | | |
|---|---|---|
| 2012/0104571 A1 | 5/2012 | Yoo |
| 2012/0104572 A1 | 5/2012 | Yoo |
| 2012/0104573 A1 | 5/2012 | Pagaila et al. |
| 2012/0112326 A1 | 5/2012 | Pagaila et al. |
| 2012/0153472 A1 | 6/2012 | Pagaila et al. |
| 2012/0153493 A1 | 6/2012 | Lee et al. |
| 2012/0175732 A1 | 7/2012 | Lin et al. |
| 2012/0199958 A1 | 8/2012 | Horibe |
| 2012/0199972 A1 | 8/2012 | Pagaila et al. |
| 2012/0292749 A1 | 11/2012 | Pagaila et al. |
| 2012/0306063 A1 | 12/2012 | Kimura et al. |
| 2013/0228904 A1 | 9/2013 | Brunnbauer et al. |

FOREIGN PATENT DOCUMENTS

| | | |
|---|---|---|
| GB | 2130794 | 6/1984 |
| TW | 200828540 | 7/2008 |
| WO | WO 2002033751 | 4/2002 |
| WO | WO2009115449 | 9/2009 |

OTHER PUBLICATIONS

Ding et al., U.S. Appl. No. 12/753,837, filed Apr. 2, 2010 for "Wafer-Level Semiconductor Device Packages with Stacking Functionality."

Chen et al., U.S. Appl. No. 12/753,843, filed Apr. 2, 2010 for "Stacked Semiconductor Device Package Assemblies with Reduced Wire Sweep and Manufacturing Methods Thereof."

Lee et al., U.S. Appl. No. 12/972,046, filed Dec. 17, 2010 for "Embedded Component Device and Manufacturing Methods Thereof."

Chen et al., U.S. Appl. No. 12/874,144, filed Sep. 1, 2010 for "Stackable Semiconductor Package and Manufacturing Method Thereof."

IMBERA Corp., IMB Technology. www.imberacorp.com (undated).

Weng et al. U.S. Appl. No. 12/648,270, filed Dec. 28, 2009 entitled "Chip Package Structure and Manufacturing Methods Thereof."

* cited by examiner

US 8,941,222 B2

WAFER LEVEL SEMICONDUCTOR PACKAGE AND MANUFACTURING METHODS THEREOF

BACKGROUND OF THE INVENTION

1. Field of the Invention

The invention relates generally to semiconductor packages and manufacturing methods thereof. More particularly, the invention relates to a wafer level semiconductor package and manufacturing methods thereof.

2. Description of Related Art

Semiconductor devices have become progressively more complex, driven at least in part by the demand for smaller sizes and enhanced processing speeds. To support increased functionality, semiconductor packages including these devices often have an large number of contact pads for external electrical connection, such as for inputs and outputs. These contact pads can occupy a significant amount of the surface area of a semiconductor package.

In the past, wafer level packaging could be restricted to a fan-in configuration in which electrical contacts and other components of a resulting semiconductor device package can be restricted to an area defined by a periphery of a semiconductor device. To address the increasing number of contact pads, wafer level packaging is no longer limited to the fan-in configuration, but can also support a fan-out configuration. For example, in a fan-out configuration, contact pads can be located at least partially outside an area defined by a periphery of a semiconductor device. The contact pads may also be located on multiple sides of a semiconductor package, such as on both a top surface and a bottom surface of the semiconductor package.

However, forming and routing the electrically connections from a semiconductor device to this increasing number of contact pads can result in greater process complexity and cost. It is against this background that a need arose to develop the wafer level semiconductor package and related methods described herein.

SUMMARY OF THE INVENTION

One aspect of the invention relates to a semiconductor package. In one embodiment, the semiconductor package includes at least one semiconductor die having an active surface, an interposer element having an upper surface and a lower surface, a package body, and a lower redistribution layer. The interposer element has at least one conductive via extending between the upper surface and the lower surface. The package body encapsulates portions of the semiconductor die and portions of the interposer element. The lower redistribution layer electrically connects the interposer element to the active surface of the semiconductor die.

In another embodiment, the semiconductor package includes at least one semiconductor die having an active surface, an interposer element having an upper surface and a lower surface, a package body, a lower redistribution layer, and an electrical contact exposed from a lower periphery of the semiconductor package. The interposer element has at least one conductive via extending between the upper surface and the lower surface. The package body encapsulates portions of the semiconductor die and portions of the interposer element. The lower redistribution layer electrically connects the interposer element to the active surface of the semiconductor die, and electrically connects the electrical contact to the active surface of the semiconductor die and the interposer element. The lower redistribution layer is disposed adjacent to the active surface of the semiconductor die.

Another aspect of the invention relates to a method of forming a semiconductor package. In one embodiment, the method includes providing a semiconductor die having an active surface, and placing an interposer element adjacent to the die. The interposer element has an upper surface and a lower surface, and has at least one first conductive via extending to the lower surface. The method further includes encapsulating portions of the semiconductor die and portions of the interposer element with an encapsulant such that the active surface of the semiconductor die, the lower surface of the interposer element, and portions of the encapsulant form a substantially coplanar surface. The method further includes forming a lower redistribution layer on the substantially coplanar surface, the lower redistribution layer electrically connecting the interposer element to the active surface of the semiconductor die.

Other aspects and embodiments of the invention are also contemplated. The foregoing summary and the following detailed description are not meant to restrict the invention to any particular embodiment but are merely meant to describe some embodiments of the invention.

Figure 1:
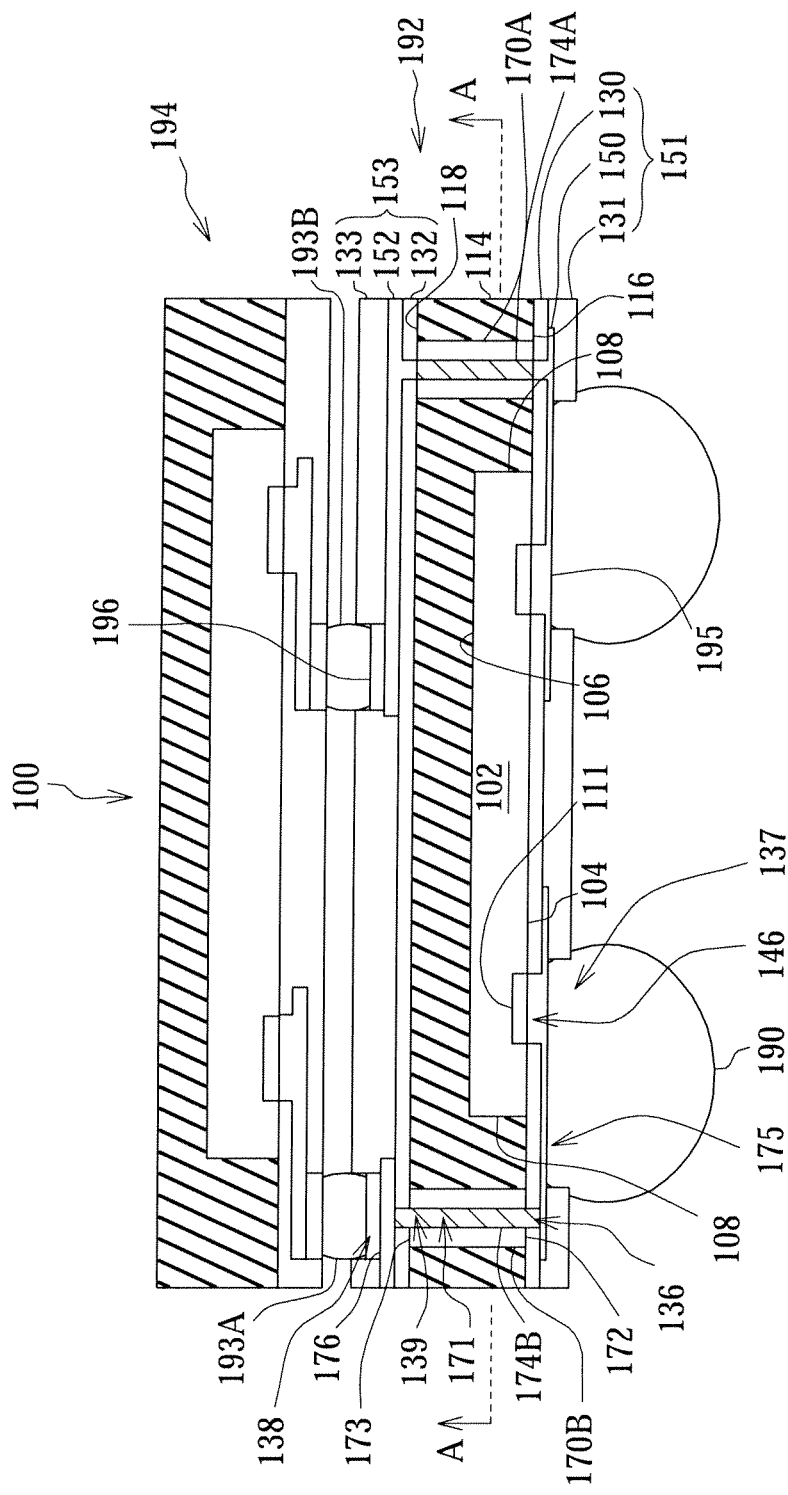
FIG. 1 is a cross section view of a stacked package assembly, according to an embodiment of the invention.

The drawings illustrate embodiments of the invention and, together with the description, serve to explain the principles of some embodiments of the invention. Reference will now be made in detail to some embodiments of the invention, examples of which are illustrated in the accompanying drawings. Wherever possible, the same reference numbers are used in the drawings and the descriptions to refer to the same or like features.

DETAILED DESCRIPTION OF THE INVENTION

Referring to FIG. 1, a cross section view is shown of a stacked package assembly 100 according to an embodiment of the invention. The stacked package assembly 100 includes a semiconductor package 192 and a semiconductor package 194 positioned above the semiconductor package 192. The semiconductor package 194 is electrically connected to the semiconductor package 192 through conductive bumps 193. It is contemplated that the semiconductor package 194 may be any form of semiconductor package, such as a wafer-level package, a BGA package, and a substrate-level package. The semiconductor package 194 may also include a combination of one or more semiconductor packages and/or one or more passive electrical components. The semiconductor package 192 includes a semiconductor device 102, which includes a lower surface 104 which in the illustrated embodiment is an active surface, i.e. the active surface having die bond pads 111, an upper surface 106, and lateral surfaces 108 disposed adjacent to a periphery of the semiconductor device 102 and extending between the lower surface 104 and the upper surface 106. In the illustrated embodiment, each of the surfaces 104, 106, and 108 is substantially planar, with the lateral surfaces 108 having a substantially orthogonal orientation with respect to the lower surface 104 or the upper surface 106, although it is contemplated that the shapes and orientations of the surfaces 104, 106, and 108 can vary for other implementations. In one embodiment, the upper surface 106 is a back surface of the semiconductor device 102, while the lower surface 104 is an active surface of the semiconductor device 102. The lower surface 104 may include the die bond pads 111 that provide input and output electrical connections for the semiconductor device 102 to conductive structures included in the package 192, such as a patterned conductive layer 150 (described below). In the illustrated embodiment, the semiconductor device 102 is an integrated circuit, although it is contemplated that the semiconductor device 102, in general, can be any active device including for example an optical or other type of sensor, a micro electromechanical system (MEMS), any passive device, or a combination thereof. The semiconductor device 102 may be an active die. While one semiconductor device is shown in the semiconductor package 192, it is contemplated that more than one semiconductor device can be included in the semiconductor package 192 for other implementations.

As shown in FIG. 1, the package 192 also includes a package body 114 that is disposed adjacent to the semiconductor device 102. In the illustrated embodiment, the package body 114 covers or encapsulates portions of the semiconductor device 102 and portions of one or more interposers 170, such as interposer elements 170 (described below). The package body 114 can provide mechanical stability as well as protection against oxidation, humidity, and other environmental conditions. In this embodiment, the package body 114 substantially covers the upper surface 106 and the lateral surfaces 108 of the semiconductor device 102, with the lower surface 104 of the semiconductor device 102 being substantially exposed or uncovered by the package body 114. The package body 114 includes a lower surface 116 and an upper surface 118. In the illustrated embodiment, each of the surfaces 116 and 118 is substantially planar, although it is contemplated that the shapes and orientations of the surfaces 116 and 118 can vary for other implementations.

In one embodiment, the package body 114 can be formed from a molding material. The molding material can include, for example, a Novolac-based resin, an epoxy-based resin, a silicone-based resin, or another suitable encapsulant. Suitable fillers can also be included, such as powdered $SiO_2$. The molding material may be a pre-impregnated (prepreg) material, such as a pre-impregnated dielectric material.

Figure 2:
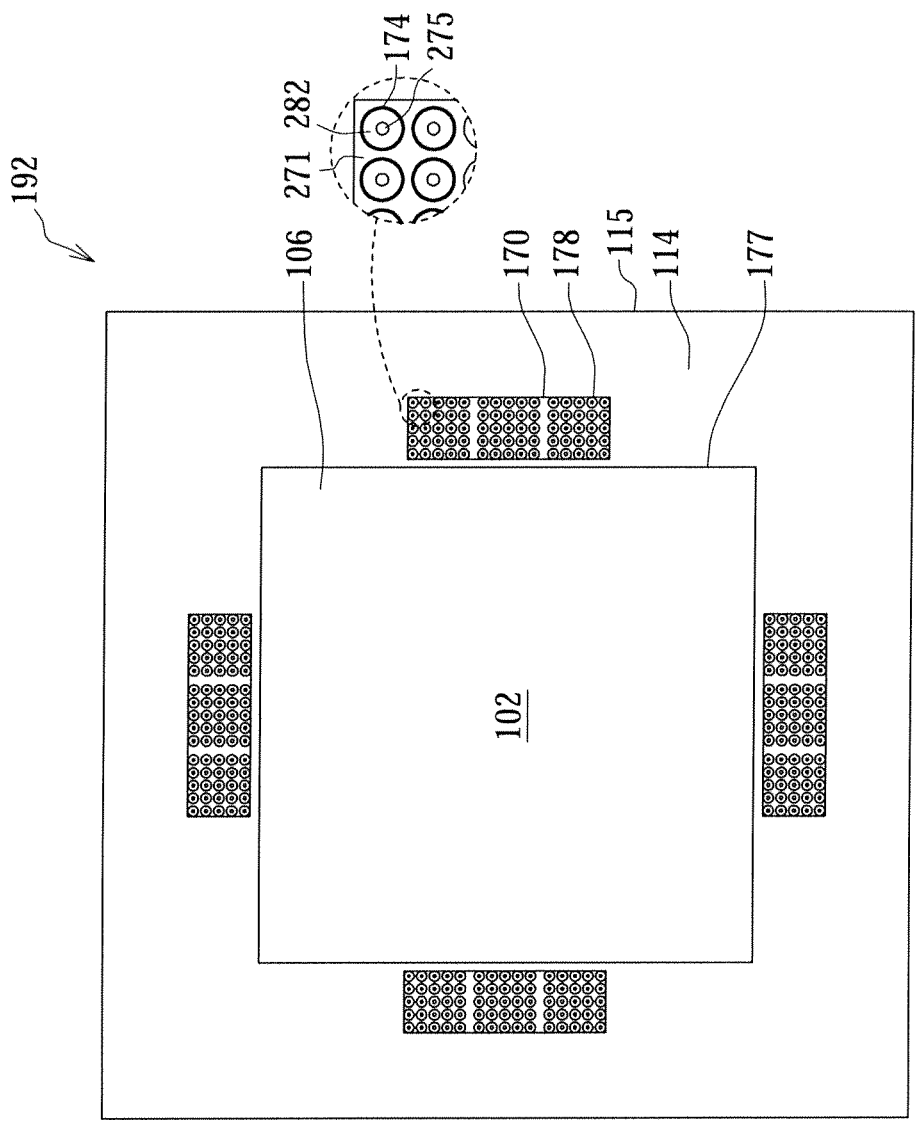
FIG. 2 is a top cross section view of a semiconductor package in a plane A-A shown in FIG. 1, according to an embodiment of the invention.

The package 192 further includes the one or more interposers 170. The interposer(s) 170 may be positioned adjacent to a perimeter 177 (i.e., a lateral periphery, see FIG. 2) of the semiconductor device 102. The interposer 170 may be a contiguous interposer that extends around the perimeter 177 of the semiconductor die (see FIG. 7) or may be uncontiguous, discrete interposer elements as shown in FIG. 2. Each interposer 170 is comprised of a substrate material that can be glass, silicon, a metal, a metal alloy, a polymer, or another suitable structural material. The interposers 170 in the package 192 can be formed from the same material, or from different materials. In one embodiment, each interposer 170 may define one or more openings 171 extending from a lower surface 172 of the interposer 170 to an upper surface 173 of the interposer 170. A conductive via 174 is formed in each of the openings 171.

Figure 3:
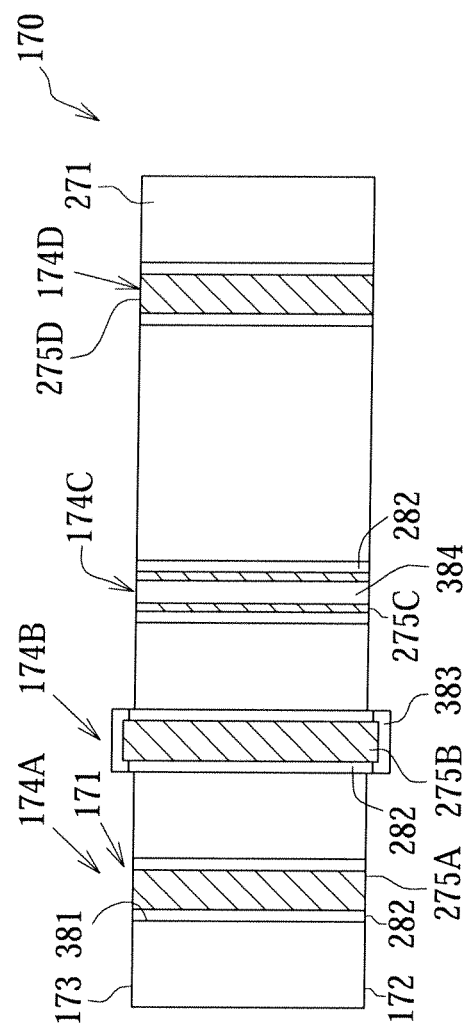
FIG. 3 is a cross section view of various conductive via embodiments within an interposer.

Referring to FIGS. 1 and 2, the interposer 170 may include a plurality of conductive vias 174. In one embodiment, a conductive via 174A is formed in each opening 171, and may be exposed at the lower surface 172 and the upper surface 173. In another embodiment, a conductive via 174B may protrude beyond the lower surface 172 and the upper surface 173. Further embodiments of the conductive vias are illustrated in FIG. 3. The conductive via 174 may be directly connected to the patterned conductive layer 150. The conductive via 174 may include an inner conductive interconnect 275. The inner conductive interconnect 275 is a conductive element that may be formed from a metallic material, typically by plating, conductive paste, or other methods known to those of ordinary skill in the art. Depending upon the substrate material of a substrate portion 271 of the interposer 170, the conductive via 174 may include an outer dielectric layer 282 of dielectric material formed between the inner conductive interconnect 275 and the substrate 271 (see FIGS. 2 and 3). The outer dielectric layer 282 may be in the form of an annular insulator.

In one embodiment, the diameter of the conductive via 174 may be in the range from about 10 μm to about 50 μm, such as from about 10 μm to about 20 μm, and from about 20 μm to about 50 μm. For diameters of the conductive via 174 in the range from about 10 μm to about 20 μm, the structure of conductive vias 174B can be used. For diameters of the conductive via 174 in the range from about 20 μm to about 50 μm, the structure of conductive vias 174A can be used.

The package 192 may include one or more redistribution layers (RDL) 151, where each RDL includes the patterned conductive layer 150 and a dielectric (or passivation) layer 130. The patterned conductive layer can be formed from copper, a copper alloy, or other metals. The redistribution layer 151 may be disposed adjacent (e.g., on, near, or adjoining) to the active surface 104 of the semiconductor device 102, and to the lower surface 116 of the package body 114. The redistribution layer 151 may include only the patterned conductive layer 150, or may be multi-layered. For example, in addition to the dielectric layer 130 and the patterned conductive layer 150, the redistribution layer 151 may include a dielectric layer 131 such that the patterned conductive layer 150 is disposed between the dielectric layers 130 and 131. It is contemplated that more or less dielectric layers may be used in other implementations. Each of the dielectric layers 130 and 131 can be formed from a dielectric material that is polymeric or non-polymeric. For example, at least one of the dielectric layers 130 and 131 can be formed from polyimide, polybenzoxazole, benzocyclobutene, or a combination thereof. The dielectric layers 130 and 131 can be formed from the same dielectric material or different dielectric materials. For certain implementations, at least one of the dielectric layers 130 and 131 can be formed from a dielectric material that is photoimageable or photoactive.

The patterned conductive layer 150 may extend through openings 136 in the dielectric layer 130 to electrically connect to the conductive vias 174, and through openings 146 in the dielectric layer 130 to electrically connect to the die bond pads 111. Package contact pads 175 for electrical connection outside of the stacked package assembly 100 may be formed from portions of the patterned conductive layer 150 exposed by openings 137 in the dielectric layer 131.

In one embodiment, the package 192 may provide a two-dimensional fan-out configuration in which the patterned conductive layer 150 extends substantially laterally outside of the periphery 177 (see FIG. 2) of the semiconductor device 102. For example, FIG. 1 shows electrical contacts, including conductive bumps 190, at least partially outside the lateral periphery 177 (see FIG. 2) of the semiconductor device 102. The conductive bumps 190 may be exposed from a lower periphery 195 of the package 192. This allows the semiconductor package 192 to be electrically connected to devices external to the semiconductor package 192 via the redistribution layer 151 and the conductive bumps 190. The conductive bumps 190 may be electrically connected to the semiconductor device 102 via the patterned conductive layer 150, and may be disposed adjacent to the package contact pads 175. The conductive bumps 190 may be electrically connected to the interposers 170 via the patterned conductive layer 150.

The conductive vias 174 included in the interposer 170 can facilitate extending a two-dimensional fan-out to a three-dimensional fan-out and/or fan-in by providing electrical pathways from the semiconductor device 102 to electrical contacts, including the conductive bumps 193. The conductive bumps 193 may be exposed from an upper periphery 196 of the package 192. This allows the semiconductor package 192 to be electrically connected to devices external to the semiconductor package 192 via the redistribution layer 153 and the conductive bumps 193. The conductive bumps 193 may be electrically connected to upper contact pads 176. The upper contact pads 176 may be formed from portions of a patterned conductive layer 152 included in a redistribution layer 153 that is disposed adjacent to the upper surface 118 of the package body 114. The patterned conductive layer 152 may be disposed between a dielectric (or passivation) layer 132 and a dielectric layer 133. The patterned conductive layer 152 may extend through openings 139 in the dielectric layer 132 to electrically connect to the conductive vias 174. The upper contact pads 176 may be formed from portions of the patterned conductive layer 152 exposed by openings 138 in the dielectric layer 133. The redistribution layer 153 may have similar structural characteristics to those previously described for the redistribution layer 152.

In one embodiment, the redistribution layer 153 may not include the dielectric layer 132, so that the patterned conductive layer 152 and the dielectric layer 133 may be adjacent to the upper surface 118 of the package body 114. In this embodiment, the patterned conductive layer 152 is also adjacent to the interposer 170, so in this embodiment the interposer 170 should be made of a non-conductive material such as glass. Alternatively, the interposer 170 can include a first portion formed of a material such as silicon and a second portion formed of a non-conductive material such as glass or some other dielectric material, on long as the patterned conductive layer 152 is adjacent to the non-conductive portion of the interposer 170.

In one embodiment, a three-dimensional fan-out configuration can be created by electrically connecting conductive bump 193A to the semiconductor device 102 through the patterned conductive layer 152, the conductive vias 174, and the patterned conductive layer 150. Alternatively or in addition, a three-dimensional fan-in configuration can be created by electrically connecting conductive bump 193B to the semiconductor device 102 through the patterned conductive layer 152, the conductive vias 174, and the patterned conductive layer 150. These three-dimensional fan-out and/or fan-in configurations can advantageously increase flexibility beyond that provided by two-dimensional fan-out in terms of the arrangement and spacing of electrical contacts both above the upper surface 118 of the package body 114, and below the lower surface 116 of the package body 114. This can reduce dependence upon the arrangement and spacing of the contact pads of the semiconductor device 102. In accordance with a fan-out configuration, the conductive bump 193A is laterally disposed at least partially outside of the periphery of the semiconductor device 102. In accordance with a fan-in configuration, the conductive bump 193B is laterally disposed within the periphery of the semiconductor device 102. It is contemplated that the conductive bumps 190 and 193, in general, can be laterally disposed within that periphery, outside of that periphery, or both, so that the package 100 may have a fan-out configuration, a fan-in configuration, or a combination of a fan-out and a fan-in configuration. In the illustrated embodiment, the conductive bumps 190 and 193 may be solder bumps, such as reflowed solder balls.

The patterned conductive layer 150, the conductive vias 174, and the patterned conductive layer 152 can be formed from a metal, a metal alloy, a matrix with a metal or a metal alloy dispersed therein, or another suitable electrically conductive material. For example, at least one of the patterned conductive layer 150, the conductive vias 174, and the patterned conductive layer 152 can be formed from aluminum, copper, titanium, or a combination thereof. The patterned conductive layer 150, the conductive vias 174, and the patterned conductive layer 152 can be formed from the same electrically conductive material or different electrically conductive materials.

FIG. 2 is a top cross section view of the semiconductor package 192 in a plane A-A shown in FIG. 1, according to an embodiment of the invention. The cross section view shows discrete interposer elements 170 disposed on each of the four sides of the semiconductor die 102 and encapsulated in the package body 114. The discrete interposer elements 170 may be disposed inwardly from a lateral periphery 115 of the package body 114. The package body 114 may extend around a lateral periphery 178 of each of the interposer elements 170, such that the lateral periphery 178 of each of the interposer elements 170 is embedded in the package body 114. Also illustrated are portions of the conductive vias 174 associated with the interposers 170, such as the inner conductive interconnects 275 and the outer dielectric layers 282 disposed adjacent to the inner conductive interconnects 275 in some embodiments. The outer dielectric layer 282 may in the form of an annular insulator. The inner conductive interconnects 275 can be made of conductive materials similar to those used to form portions of the conductive via 174 described with reference to FIG. 1. The outer dielectric layer 282 can be made of materials similar to those used to form the dielectric layers 130 and 131 described with reference to FIG. 1. The cross section view also shows the upper surface 106 of the die 102. In this embodiment, unused conductive vias 174 may be left electrically unconnected.

Figure 8A:
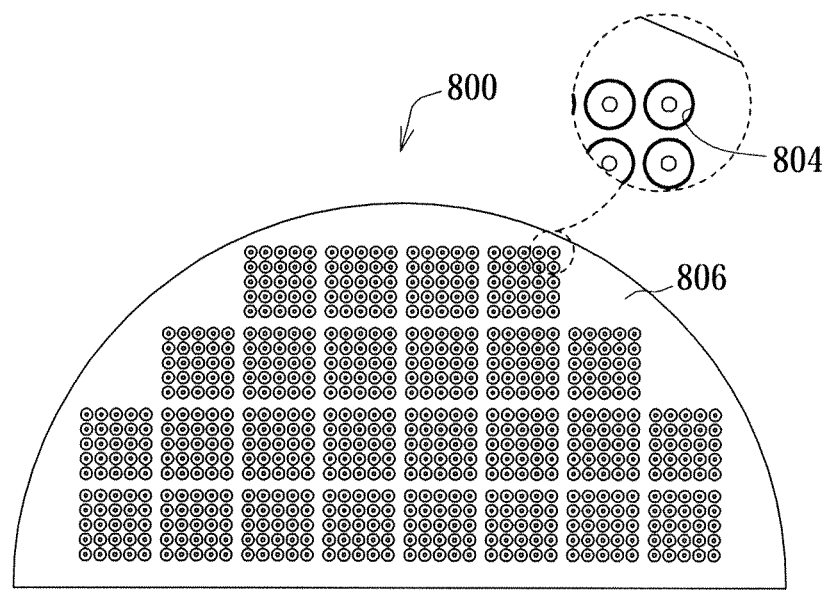
FIG. 8A through FIG. 8G are views showing a method of forming a semiconductor package, according to an embodiment of the invention.
Figure 8B:
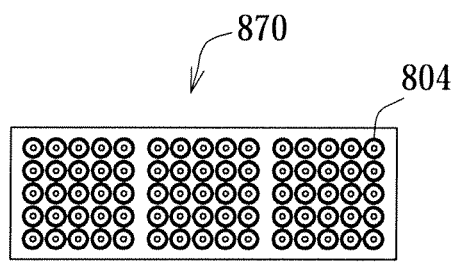

The discrete interposer elements 170 can be singulated from an interposer wafer such that the interposer elements 170 have varying sizes and shapes based on the number and positions of through via connections required for any given semiconductor package (see FIG. 8B). This approach provides the flexibility to enable manufacturing of multiple package types with different numbers and positions of through via connections from the same interposer wafer. In addition, the interposer elements 170 can be sized to correspond to each package type so that unused through via connections are reduced or eliminated. Since there is no need, for example, to form a custom substrate for each package type to reduce the amount of unused substrate area, this approach can reduce manufacturing cost and complexity.

In addition, since the discrete interposer elements 170 may be small relative to the package body 114, the discrete interposer elements 170 may have little or no effect on the coefficient of thermal expansion (CTE) of the package 192. Instead, the CTE of the package body 114 can be adjusted to better match the CTE of the semiconductor device 102, and therefore to increase reliability. For example, filler content of the mold compound used to form the package body 114 can be adjusted so that the CTE of the package body 114 more closely matches the CTE of the semiconductor device 102.

FIG. 3 is a cross section view of various conductive via embodiments within the interposer 170. In one embodiment, the interposer 170 defines the opening 171, and includes the conductive via 174A at least partially disposed in the opening 171, where the conductive via 174A includes the inner conductive interconnect 275A. The conductive via 174A may be a through silicon via (TSV). The conductive via 174A includes inner conductive interconnect 275A exposed at the upper surface 173 and the lower surface 172 of the interposer 170, and the outer dielectric layer 282 surrounding the inner conductive interconnect 275A. The outer dielectric layer 282 may be disposed adjacent to a lateral surface 381 of the opening 171. In this embodiment, the outer dielectric layer 282 and the inner conductive interconnect 275A may substantially fill the opening 171.

In another embodiment, the conductive via 174B includes an inner conductive interconnect 275B that protrudes beyond the upper surface 173 and the lower surface 172 of the interposer 170. In this embodiment, the outer dielectric layer 282 may also protrude beyond the upper surface 173 and the lower surface 172. A conductive layer 383 may be disposed adjacent to protruding portions of the inner conductive interconnect 275B and the outer dielectric layer 282.

In a further embodiment, a conductive via 174C includes an inner conductive interconnect 275C that is an annular plating layer, and the outer dielectric layer 282. The inner conductive interconnect 275C may define an opening 384. Alternatively, the inner conductive interconnect 275C may be filled by an inner dielectric layer (not shown).

In a further embodiment, a conductive via 174D includes an inner conductive interconnect 275D that is disposed directly adjacent to the substrate 271 of the interposer 170. In this embodiment, the interposer 170 is made of a non-conductive material such as glass. The inner conductive interconnect 275D may define an opening (not shown) similar to the opening 384.

In other respects, the conductive vias 174A, 174B, 174C, and 174D are similar to the conductive via 174 and perform a similar function of routing I/O from the top package 194 to the bottom package 192 and to the conductive bumps 190 to distribute I/O outside the package 100 to other devices (see FIG. 1).

Employment of interposers 170 to provide electrical connectivity between a redistribution layer adjacent to an upper surface of a semiconductor package (such as the redistribution layer 153 of FIG. 1) and a redistribution layer adjacent to a lower surface of a semiconductor package (such as the redistribution layer 151 of FIG. 1) may result in reduced via diameter compared to other approaches. For example, the conductive vias 174 may have a diameter in the range from about 10 µm to about 50 µm, such as in the range from about 10 µm to about 20 µm, about 20 µm to about 30 µm, or in the range from about 30 µm to about 50 µm. These diameters are smaller than a typical diameter (greater than 75 µm) of through package vias, which may be formed by laser drilling through a mold compound. Because of the reduced diameter of the conductive vias 174, corresponding capture pads for the conductive vias 174, such as portions of the patterned conductive layers 150 and 152 of FIG. 1, can be of reduced size and pitch. This results in higher density redistribution routing traces, such as between the die 102 and the interposers 170, and may enable routing to be performed without adding additional redistribution layers. The reduced diameter of each conductive via 174 can also can allow for higher connectivity density than would be possible with the larger laser-drilled vias through the mold compound. In addition, because of their smaller diameter, the conductive vias 174 can be easier to fill with conductive and/or non-conductive material while avoiding undesirable effects such as processor solution and polymer leakage and entrapment.

Figure 4A:
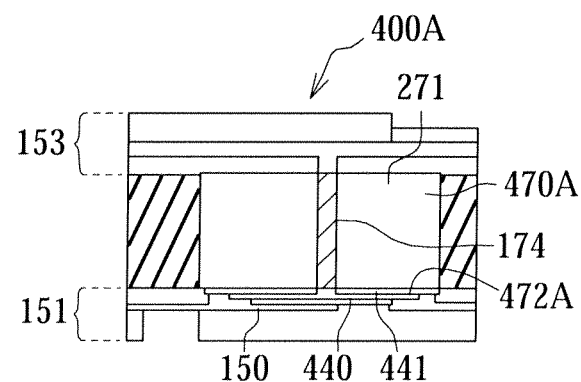
FIGS. 4A through 4B are cross section views of a portion of a semiconductor package including an interposer, according to an embodiment of the invention.
Figure 4B:
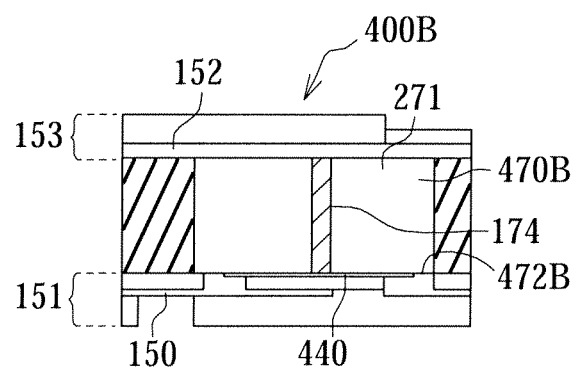

FIGS. 4A through 4B are cross section views of a portion of a semiconductor package 400 including an interposer 470, according to an embodiment of the invention. The semiconductor package 400 and the interposer 470 are generally similar to the semiconductor package 192 and the interposer 170 of FIG. 1, except that the interposer 470 includes a conductive interconnect 440. Referring to FIG. 4A, in one embodiment of a semiconductor package 400A, the conductive interconnect 440 may be disposed on and extend substantially laterally along a lower surface 472A of an interposer 470A. In this embodiment, a dielectric layer 441 is disposed between the conductive interconnect 440 and the substrate 271 of the interposer 470A. Referring to FIG. 4B, in one embodiment of a semiconductor package 400B, the conductive interconnect 440 may be disposed on and extend substantially laterally along a lower surface 472B of an interposer 470B. In this embodiment, the conductive interconnect 440 is adjacent to the substrate 271 of the interposer 470B, so in this embodiment the interposer 470B should be made of a non-conductive material such as glass. Alternatively, the interposer 470B can include a first portion formed of a material such as silicon and a second portion formed of a non-conductive material such as glass or another dielectric material, so long as the conductive interconnect 440 is adjacent to the non-conductive portion of the interposer 470B.

One advantage of the conductive interconnect 440 is that the conductive interconnect 440 can serve as an additional trace layer for redistribution trace routing, which can reduce the number of redistribution layers in the semiconductor package 400 needed for this purpose. A reduction in the number of redistribution layers in the semiconductor package 400 can result in reduced manufacturing process complexity and cost. In addition, the conductive interconnect 440 can be buried under a redistribution layer, and therefore does not take up space on an external surface of the semiconductor package 402.

In the embodiments of FIGS. 4A and 4B, a semiconductor device (such as the semiconductor device 102 of FIG. 1) is electrically connected to the upper redistribution layer 153 through the patterned conductive layer 150 included in a lower redistribution layer 151, the conductive interconnect 440, and the conductive via 174 included in the interposer 470. The lower redistribution layer 151 may cover the conductive interconnect 440. Alternatively, a protective layer (not shown) may be disposed between the conductive interconnect 440 and the lower redistribution layer 151. In one embodiment, the conductive interconnect 440 may electrically connect the semiconductor device 102 to a passive electrical component (see FIG. 5).

Referring to FIG. 4B, in one embodiment, the dielectric layer 132 (see FIG. 1) may be omitted from the upper redistribution layer 153, so that the patterned conductive layer 152 is disposed adjacent to the substrate 271 of the interposer 470B. In this embodiment, the interposer 470B is made of a non-conductive material such as glass.

Figure 5:
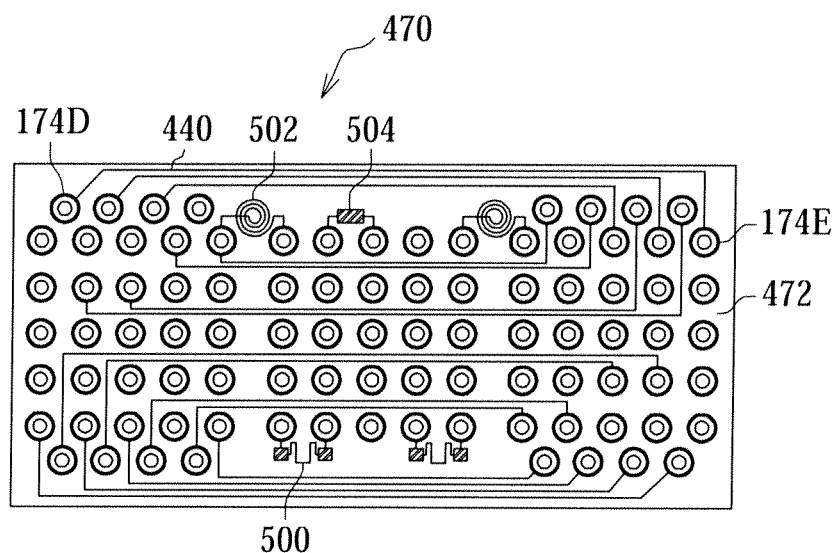
FIG. 5 is a bottom view of an interposer, according to an embodiment of the invention.

FIG. 5 is a bottom view of the interposer 470, according to an embodiment of the invention. The interposer 470 includes multiple conductive vias 174 (such as conductive vias 174D and 174E) and multiple conductive interconnects 440. The conductive interconnects 440 may form a routing layer. In one embodiment, the routing layer is on the lower surface of the interposer 470. The conductive interconnects 440 may connect the conductive via 174D to the conductive via 174E. In one embodiment, the conductive via 174D may provide electrical connectivity through a semiconductor package such as the semiconductor package 400 of FIGS. 4A and 4B, while the conductive via 174E may provide electrical connectivity to a patterned conductive layer such as the patterned conductive layer 150. The conductive interconnects 440 may allow for crossing over of conductors during redistribution layer routing by routing across the interposer 470 on a surface of the interposer 470.

In one embodiment, the conductive interconnects 440 may electrically connect the conductive vias 174 to one or more passive electrical components known to one of ordinary skill in the art, such as a resistor 500, an inductor 502, and a capacitor 504. These passive electrical components, like the conductive interconnects 440, are disposed on the lower surface 472 of the interposer 470.

Figure 6:
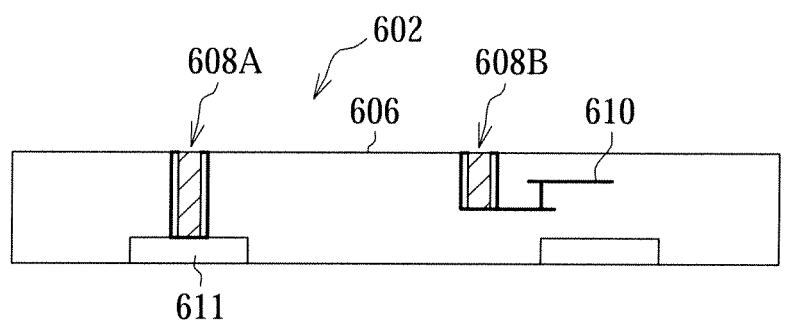
FIG. 6 is a cross section view of a semiconductor device including vias exposed adjacent to a back surface of the semiconductor device, according to an embodiment of the invention.

FIG. 6 is a cross section view of a semiconductor device 602 including conductive vias 608 exposed adjacent to a back surface 606 of the semiconductor device 602, according to an embodiment of the invention. The semiconductor device 602 is in most respects similar to the semiconductor device 102 of FIG. 1, except for the conductive vias 608. The conductive vias 608 are similar to the conductive vias 174. One advantage of the conductive vias 608 is that the conductive vias 608 are formed in the semiconductor device 602. This can reduce or eliminate the need for separate interposers, which can save space in a semiconductor package such as the semiconductor package 192 of FIG. 1. In one embodiment, the conductive via 608 can electrically connect the semiconductor device 602 to a redistribution layer such as the redistribution layer 153 of FIG. 1. The conductive via 608 may electrically connect a die bonding pad 611 to circuitry external to the semiconductor device 602, such as the conductive layer 152 (see FIG. 1) included in the redistribution layer 153. Alternatively or in addition, the conductive via 608 may electrically connect circuitry 610 internal to the semiconductor device 602 to circuitry external to the semiconductor device 602, such as the conductive layer 152 included in the redistribution layer 153.

Figure 7:
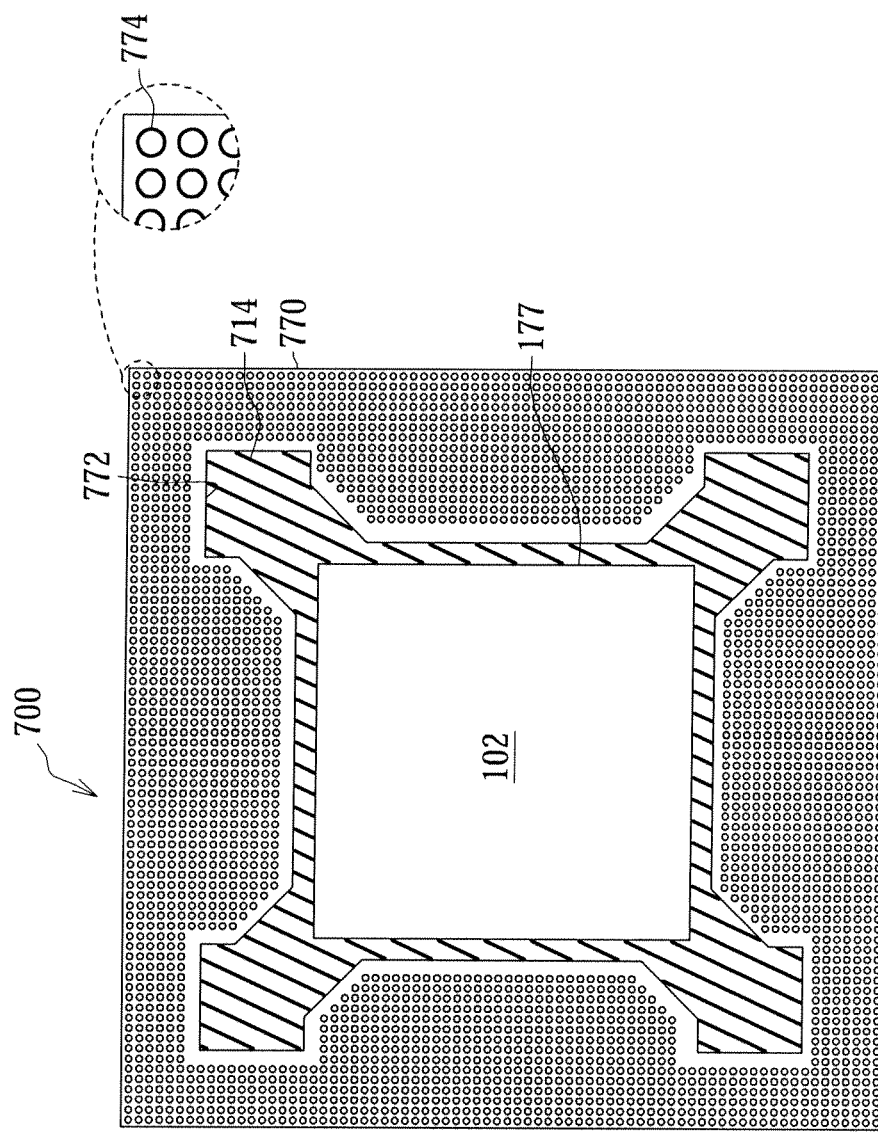
FIG. 7 is a top cross section view of a semiconductor package, according to an embodiment of the invention.

FIG. 7 is a top cross section view of a semiconductor package 700, according to an embodiment of the invention. The cross section view shows an interposer 770 surrounding a package body 714 encapsulating the semiconductor device 102. The cross section view shows conductive vias 774 associated with the interposer 770. The semiconductor package 700 is in most respects similar to the semiconductor package 192 described with reference to FIG. 1 except for the shape of the interposer 770. In this embodiment, the interposer 770 is a contiguous interposer extending around the lateral periphery 177 of the semiconductor die 102. In particular, the conductive vias 774 and the package body 714 are similar to the conductive vias 174 and the package body 114 described with reference to FIG. 1.

The interposer 770 defines an opening 772 substantially filled with the package body 714. The package body 714 can decouple the semiconductor package 700 from any stresses imposed by the interposer 770. In this embodiment, unused conductive vias 774 may be left electrically unconnected.

FIG. 8A through FIG. 8G are views showing a method of forming a semiconductor package, according to an embodiment of the invention. For ease of presentation, the following manufacturing operations are described with reference to the package 192 of FIG. 1. However, it is contemplated that the manufacturing operations can be similarly carried out to form other semiconductor packages that may have different internal structure from the package 192. In addition, it is contemplated that these manufacturing operations can form an array of connected semiconductor packages that can be separated, such as through singulation, to form multiple individual semiconductor packages.

FIG. 8A shows an interposer wafer (or interposer panel) 800. The interposer wafer 800 can be formed from glass, silicon, a metal, a metal alloy, a polymer, or another suitable structural material. The interposer wafer 800 includes conductive vias 804 that are similar to the conductive vias 174 of FIGS. 1 through 3. In one embodiment, the conductive vias 804 may extend entirely through the interposer wafer 800, and may protrude beyond an interposer 870. The interposer 870 may be a discrete, uncontiguous interposer element. Alternatively, the conductive vias 804 may be exposed at a lower surface 806 of the interposer wafer 800, but may extend only partially through the interposer wafer 800. The shape of the interposer wafer 800 may be circular, rectangular, square, or any other shape determined to be feasible for manufacturing operations by one of ordinary skill in the art.

Next, FIG. 8B shows the interposer 870. The interposer 870 may be separated from the interposer wafer 800, such as by singulation including singulation methods known to those of ordinary skill in the art such as saw singulation. One advantage of separating the interposer 870 from the interposer wafer 800 is that a standard size interposer wafer or panel 800 is can be used. The interposer wafer 800 can be singulated into interposers of varying sizes and shapes based on the number and positions of through via connections required for any given semiconductor package. The conductive vias 804 may extend entirely through the interposer 870, and may protrude beyond the interposer 870. Alternatively, as described for the interposer wafer 800 of FIG. 8A, the conductive vias 804 may extend only partially through the interposer 870.

Figure 8C:
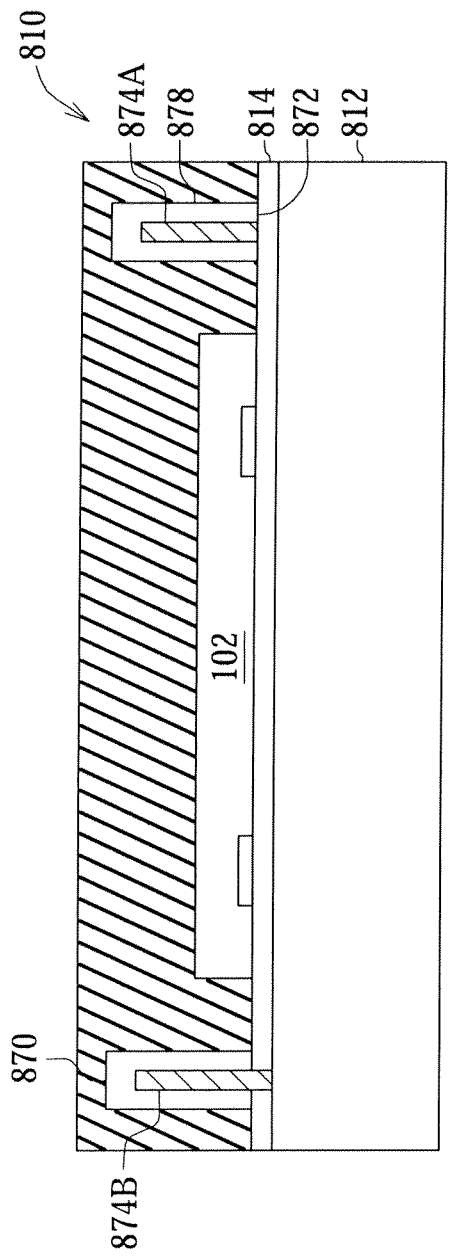

Next, FIG. 8C shows a molded structure 810. In one embodiment, the die 102 and one or more of the interposers 870 are disposed adjacent to a carrier 812. Advantageously, the die 102 and the interposers 870 are placed or located on the carrier using commercially available pick and place and/or die attach equipment. The die 102 and the interposers 870 may be attached to the carrier 812 by an adhesive layer 814. In one embodiment, the interposer 870 includes a conductive via 874A that is exposed at a lower surface 872 of the interposer 870. In another embodiment, the interposer 870 includes a conductive via 874B that protrudes beyond the lower surface 872 into the adhesive layer 814. Then, the die 102 and the interposers 870 are encapsulated by molding material to form the molded structure 810. The molding material may surround a lateral periphery 878 of the interposer 870. The molded structure 810 is made of materials similar to those forming the package body 114 of FIG. 1. The molded structure 810 can be formed using any of a number of molding techniques, such as transfer molding, injection molding, or compression molding. To facilitate proper positioning of the molded structure 810 during subsequent singulation operations, fiducial marks can be formed in the molded structure 810 by various methods, such as laser marking.

Figure 8D:
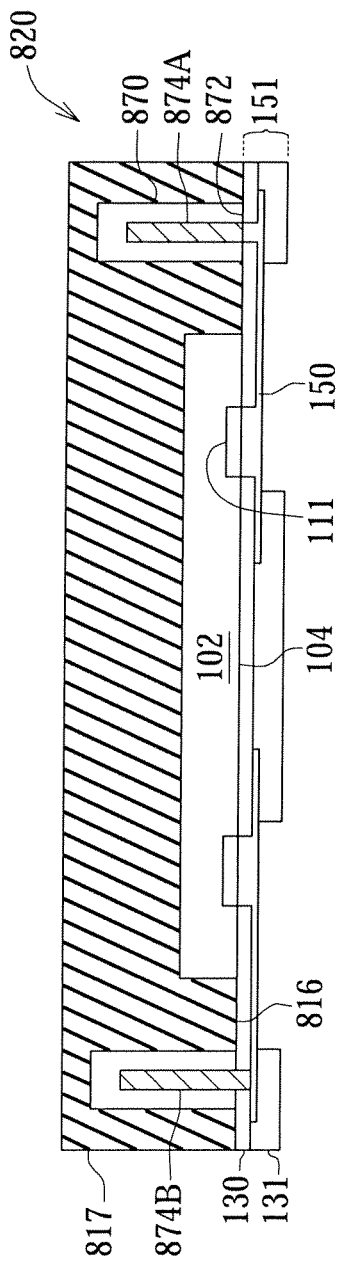

Next, FIG. 8D shows a molded structure 820. The molded structure 820 is formed by first removing the molded structure 810 from the carrier 812 in FIG. 8C. Then, a redistribution layer including the redistribution layer 151 (see FIG. 1) is formed adjacent to the active surface 104 of the die 102, the lower surface 816 of the package body 817, and the lower surface 872 of each of the interposers 870. A dielectric material is applied using any of a number of techniques, such as printing, spinning, or spraying, and is then patterned to form a dielectric layer including the dielectric layer 130 (see FIG. 1). As a result of patterning, the dielectric layer 130 is formed with openings, including openings that are aligned with the active surface 104 and sized so as to at least partially expose the die bond pads 111 of the semiconductor device 102. In one embodiment, the dielectric layer further includes openings that are aligned and sized so as to at least partially expose the conductive vias 874A. In another embodiment, the dielectric layer includes openings through which the conductive vias 874B extend. Patterning of the dielectric material to form the dielectric layer 130 can be carried out in any of a number of ways, such as photolithography, chemical etching, laser drilling, or mechanical drilling, and the resulting openings can have any of a number of shapes, such as a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

An electrically conductive material is then applied to the dielectric layer 130 and drawn into the openings defined by the dielectric layer 130 using any of a number of techniques, such as chemical vapor deposition, electroless plating, electrolytic plating, printing, spinning, spraying, sputtering, or vacuum deposition, and is then patterned to form an electrically conductive layer including the patterned conductive layer 150 (see FIG. 1). As a result of patterning, the patterned conductive layer 150 is formed with electrical interconnects that extend laterally along certain portions of the dielectric layer 130 and with gaps between the electrical interconnects that expose other portions of the dielectric layer 130. The patterned conductive layer 150 included in the redistribution layer 151 may be electrically connected to the die bond pads 111 and the conductive vias 874. Patterning of the electrically conductive layer 150 can be carried out in any of a number of ways, such as photolithography, chemical etching, laser drilling, or mechanical drilling.

A dielectric material is then applied to the patterned conductive layer 150 and the exposed portions of the dielectric layer 130 using any of a number of techniques, such as printing, spinning, or spraying, and is then patterned to form a dielectric layer including the dielectric layer 131 (see FIG. 1). As a result of patterning, the dielectric layer 131 is formed with openings that are aligned with the electrically conductive layer 150, including openings that are aligned so as to at least partially expose the electrically conductive layer 150 and are sized so as to accommodate solder bumps. Patterning of the dielectric material 131 can be carried out in any of a number of ways, such as photolithography, chemical etching, laser drilling, or mechanical drilling, and the resulting openings can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

Figure 8E:
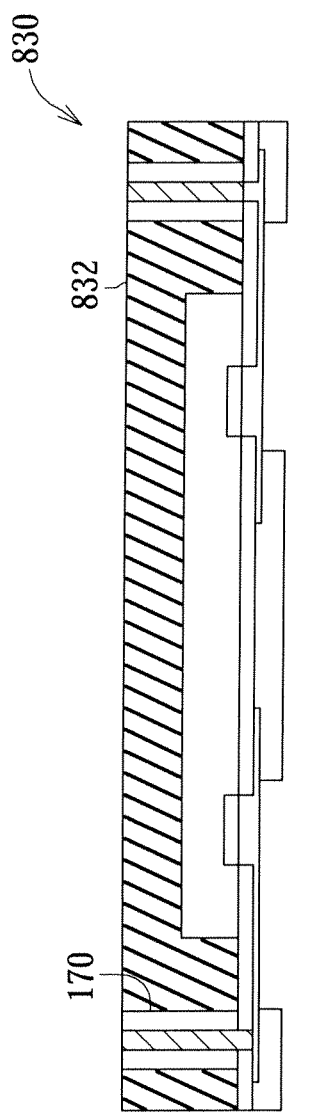

Next, FIG. 8E shows a molded structure 830. In one embodiment, a portion of each interposer 870 is removed to form the interposers 170, along with a portion of the molding material. This is typically done by backgrinding, CMP, or other techniques resulting in a substantially coplanar surface 832.

Figure 8F:
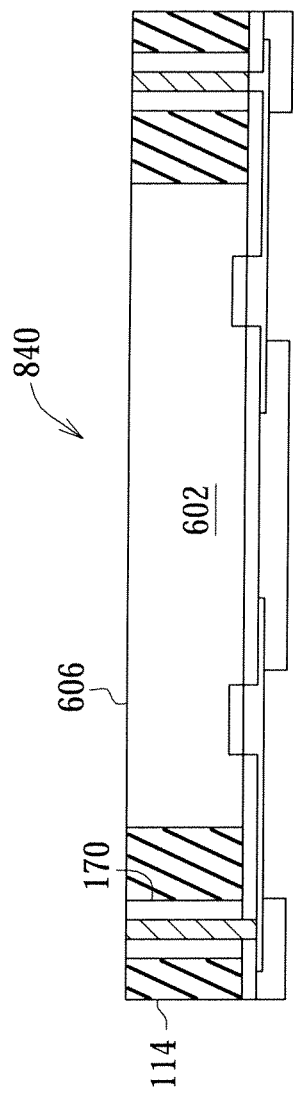

In an alternative embodiment to FIG. 8E, FIG. 8F shows a molded structure 840. The molded structure 840 is similar to the molded structure 830 of FIG. 8E, except that additional backgrinding or other removal techniques are performed to expose the back surface 606 of the semiconductor die 602, resulting in a substantially coplanar surface 836 between the die 602, the package body 114, and the interposer 170. In one embodiment, if the die corresponds to the die 602 of FIG. 6, enough molding material is removed to expose the back surface 606 of the die 602 and the conductive interconnects 610 (see FIG. 6).

Figure 8G:
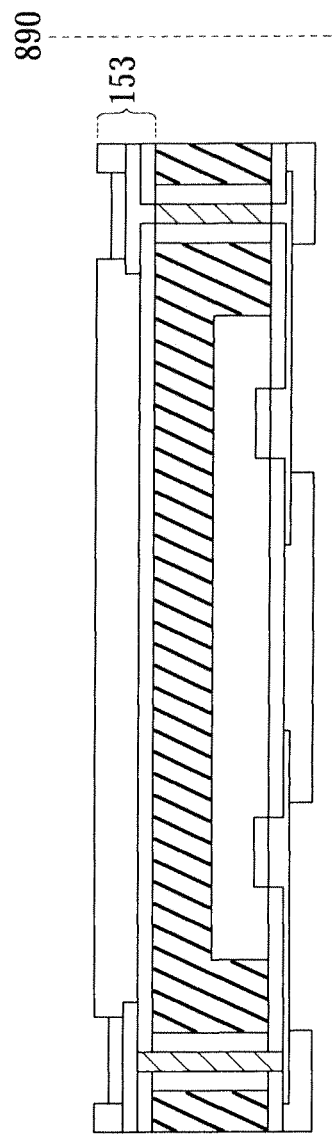

Next, FIG. 8G shows the semiconductor package 192 of FIG. 1. To form the semiconductor package 192, a redistribution layer 153 is formed adjacent to an upper surface 832 of the molded structure 830 (see FIG. 8E). The redistribution layer 153 is formed similarly to the redistribution layer 151, and is electrically connected to the conductive vias 174. In one embodiment, singulation is next carried out along the dashed lines 890 to separate the semiconductor packages 192.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale, and that there may be other embodiments of the present invention which are not specifically illustrated. Thus, the specification and the drawings are to be regarded as illustrative rather than restrictive. Additionally, the drawings illustrating the embodiments of the present invention may focus on certain major characteristic features for clarity. Furthermore, modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
   at least one semiconductor die having an active surface;
   an interposer element having an upper surface and a lower surface, the interposer element having at least one conductive via extending between the upper surface and the lower surface;
   a package body encapsulating portions of the semiconductor die and portions of the interposer element; and
   a lower redistribution layer that electrically connects the interposer element to the active surface of the semiconductor die.

2. The semiconductor package of claim 1, further comprising an upper redistribution layer adjacent to the upper surface of the interposer element.

3. The semiconductor package of claim 2, further comprising an electrical contact exposed from an upper periphery of the semiconductor package, wherein the electrical contact electrically connects another semiconductor package to the upper redistribution layer.

4. The semiconductor package of claim 1, wherein:
the conductive via includes an inner conductive interconnect and an outer dielectric layer surrounding the inner conductive interconnect; and
the inner conductive interconnect is exposed at the lower surface of the interposer element to electrically connect with the lower redistribution layer.

5. The semiconductor package of claim 1, wherein:
the conductive via includes an inner conductive interconnect and an outer dielectric layer surrounding the inner conductive interconnect; and
the inner conductive interconnect protrudes beyond the lower surface of the interposer element to electrically connect with the lower redistribution layer.

6. The semiconductor package of claim 2, wherein:
the conductive via includes an inner conductive interconnect and an outer dielectric layer surrounding the inner conductive interconnect; and
the inner conductive interconnect is coplanar with the upper surface of the interposer element to electrically connect with the upper redistribution layer.

7. The semiconductor package of claim 1, wherein the interposer element is one of a plurality of discrete interposer elements positioned around a lateral periphery of the semiconductor die.

8. The semiconductor package of claim 7, wherein each of the plurality of discrete interposer elements is disposed inwardly from a lateral periphery of the package body.

9. The semiconductor package of claim 1, wherein the interposer element includes a routing layer extending laterally along a lower surface of the interposer element.

10. The semiconductor package of claim 9, wherein the routing layer includes a passive electrical component adjacent to the lower surface of the interposer element, wherein the routing layer electrically connects the passive electrical component to the at least one conductive via.

11. A semiconductor package, comprising:
at least one semiconductor die having an active surface;
an interposer element having an upper surface and a lower surface, the interposer element having at least one conductive via extending between the upper surface and the lower surface;
a package body encapsulating portions of the semiconductor die and portions of the interposer element;
a lower redistribution layer that electrically connects the interposer element to the active surface of the semiconductor die; and
an electrical contact exposed from a lower periphery of the semiconductor package, wherein:
the lower redistribution layer electrically connects the electrical contact to the active surface of the semiconductor die and the interposer element; and
the lower redistribution layer is disposed adjacent to the active surface of the semiconductor die.

12. The semiconductor package of claim 11, further comprising an upper redistribution layer adjacent to the upper surface of the interposer element.

13. The semiconductor package of claim 12, further comprising another semiconductor package electrically connected to the upper redistribution layer.

14. The semiconductor package of claim 11, wherein the interposer element is one of a plurality of discrete interposer elements positioned around a lateral periphery of the semiconductor die.

15. The semiconductor package of claim 14, wherein the package body extends around a lateral periphery of each of the plurality of discrete interposer elements.

16. A semiconductor package, comprising:
at least one semiconductor die having an active surface;
a package body encapsulating portions of the semiconductor die;
an interposer element having an upper surface and a lower surface, the interposer element having at least one conductive via extending between the upper surface and the lower surface and surrounding the package body; and
a lower redistribution layer that electrically connects the interposer element to the active surface of the semiconductor die.

17. The semiconductor package of claim 16, wherein the interposer element defines an opening for filling with the package body.

18. The semiconductor package of claim 17, wherein the opening has an arrow shape at four corners pointing outwardly.

19. The semiconductor package of claim 16, wherein the interposer is a contiguous interposer extending around the lateral periphery of the semiconductor die.

20. The semiconductor package of claim 16, further comprising an upper redistribution layer adjacent to the upper surface of the interposer element.

* * * * *